(12) United States Patent
Masuda

(10) Patent No.: US 6,450,039 B1
(45) Date of Patent: Sep. 17, 2002

(54) PRESSURE SENSOR AND METHOD OF MANUFACTURING THE SAME

(75) Inventor: Takashi Masuda, Tokyo (JP)

(73) Assignee: Yamatake Corporation, Tokyo (JP)

( * ) Notice: Subject to any disclaimer, the term of this patent is extended or adjusted under 35 U.S.C. 154(b) by 0 days.

(21) Appl. No.: 09/613,820

(22) Filed: Jul. 10, 2000

(30) Foreign Application Priority Data

Jul. 16, 1999 (JP) .............................. 11-203696

(51) Int. Cl.⁷ ................................................ G01L 7/00
(52) U.S. Cl. ........................................................ 73/756
(58) Field of Search .......................... 73/721, 724, 723, 73/722, 727, 718, 706, 720, 756; 338/42, 36; 257/419; 361/283.4; 220/581

(56) References Cited

U.S. PATENT DOCUMENTS 4,665,754 A * 5/1987 Glenn et al. .................. 73/727
5,581,226 A * 12/1996 Shah ............................ 338/42

* cited by examiner

Primary Examiner—William Oen
(74) Attorney, Agent, or Firm—Blakely Sokoloff Taylor & Zafman

(57) ABSTRACT

A pressure sensor includes a cylindrical sensor package, glass base, sensor chip, and electrode pins. The glass base is seal-bonded to an inner surface of the sensor package to close a space in the sensor package. The sensor chip is mounted on the glass base and has electrodes and a metal bonding portion on its surface opposing the glass base. The bonding portion is die-bonded to a surface of the glass base. The electrode pins are arranged to oppose the electrodes and buried to extend through the glass base. One end of each lead member exposed from the surface of the glass surface is electrically bonded to a corresponding electrode.

10 Claims, 5 Drawing Sheets

PRESSURE SENSOR AND METHOD OF MANUFACTURING THE SAME

BACKGROUND OF THE INVENTION

The present invention relates to an electrostatic capacitive or piezoelectric pressure sensor and a method of manufacturing the same and, more particularly, to a bonding structure and bonding method for a sensor chip and sensor package employed when electrodes of the sensor chip are extracted from the lower side of the sensor chip.

As a conventional pressure sensor, an electrostatic capacitive pressure sensor is known. The electrostatic capacitive pressure sensor has a substrate with a recess, a diaphragm supported on a substrate at its periphery and arranged on the recess, a stationary electrode formed on the bottom surface of the recess, and a movable electrode formed on the diaphragm to oppose the stationary electrode. In the pressure sensor having this arrangement, when the diaphragm deforms upon reception of an external pressure, the distance between the movable and stationary electrodes changes to change the electrostatic capacitance between them. The pressure applied to the diaphragm is measured on the basis of this change in electrostatic capacitance.

As another pressure sensor, a piezoelectric pressure sensor is known. The piezoelectric pressure sensor has, in place of an electrode, a strain gauge with a piezoresistive effect on a semiconductor diaphragm. The strain gauge is deformed by a pressure applied to the diaphragm. The pressure is measured by detecting a change in resistance of the strain gauge produced by the piezoresistive effect.

To measure a pressure by using the pressure sensor described above, as shown in FIG. 6, a sensor chip 23 is mounted on a cylindrical glass base 22 in a cylindrical metal package 21 sealed by a corrosion-resistant diaphragm 24, and a sealed liquid 25 such as silicone oil is sealed in the metal package 21. The pressure is transmitted to the sensor chip 23 by this structure. The electrical connection between the sensor chip 23 and the outside is realized by connecting electrode extraction pins 26 hermetically sealed with glass and electrodes formed on the upper surface of the sensor chip 23 with wires 27.

With the arrangement as shown in FIG. 6, since the volume of the sealed liquid 25 changes in accordance with a temperature change, an error occurs in transmission of the pressure, making it difficult to measure the pressure at high precision. If the diaphragm 24 is torn and the sealed liquid 25 leaks, a measurement target liquid (gas) is contaminated by the sealed liquid 25. Thus, this arrangement is difficult to use for sanitary applications.

In order to solve these problems, the sealed liquid may be eliminated. In this case, as the sensor chip comes into direct contact with the measurement target liquid, corrosion of the sensor chip and physical impact applied to the sensor chip pose problems. For this reason, electrodes and wires cannot be formed on the upper surface of the chip, and the electrodes are extracted from the lower side of the sensor chip.

In the conventional pressure sensor, however, if the sensor chip is fixed, the electrodes cannot be extracted from the lower side of the sensor chip. More specifically, when the sensor chip extends to the lower surface of the metal package and the electrodes are extracted from the lower side of the sensor chip, a stress is likely to occur in the bonding portion between the sensor chip and the seal surface of the package. For this reason, the diaphragm of the sensor chip need be set away from the seal surface, leading to an increase in size of the sensor.

In the pressure sensor, a thermal stress from the metal package should not be transmitted to the sensor chip as much as possible. The measuring method shown in FIG. 6 realizes this by mounting the sensor chip 23 on the glass base 22 and bonding the glass base 22 to the metal package 21. With this method, the number of manufacturing steps increases. Also, the number of bonding surfaces increases, thereby degrading the yield.

In the pressure sensor shown in FIG. 6, since the electrode extraction pins 26 are fixed to the metal package 21 with a glass hermetic seal 27, distances d1 and d2 between the electrode extraction pins 26 cannot be decreased because holes must be formed. Also, an insulating distance (the size of the glass hermetic seal 27) d3 cannot be decreased.

SUMMARY OF THE INVENTION

It is an object of the present invention to provide a pressure sensor which, in a structure where electrodes are extracted from the lower side of a sensor chip, the sensor chip can be fixed and the electrodes can be extracted simultaneously while improving the yield, and a method of manufacturing the same.

In order to achieve the above object, according to the present invention, there is provided a pressure sensor comprising a cylindrical sensor package, a glass base seal-bonded to an inner surface of the sensor package to close a space in the sensor package, a sensor chip mounted on the glass base and having electrodes and a metal bonding portion on a surface thereof opposing the glass base, the bonding portion being die-bonded to a surface of the glass base, and lead members arranged to oppose the electrodes and buried to extend through the glass base, one end of each of the lead members exposed from the surface of the glass surface being electrically bonded to a corresponding one of the electrodes.

DESCRIPTION OF THE PREFERRED EMBODIMENT

The present invention will be described in detail with reference to the accompanying drawings.

Figure 1A:
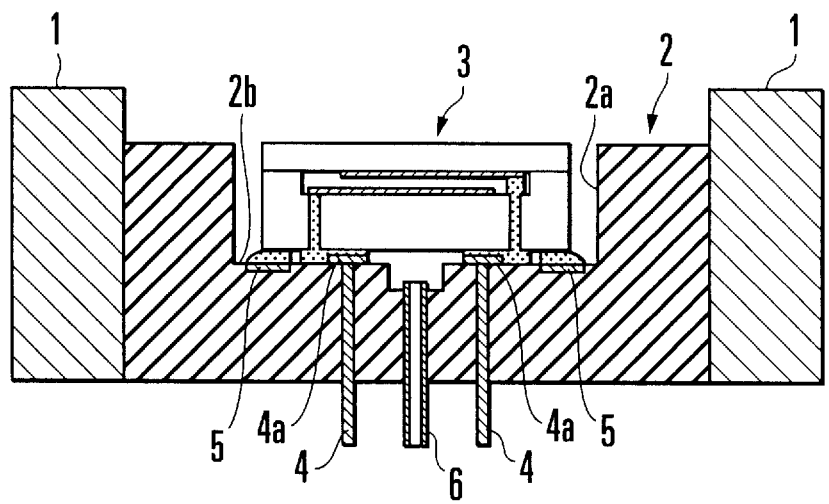
FIGS. 1A and 1B are sectional and plan views, respectively, of a pressure sensor according to an embodiment of the present invention.
Figure 1B:
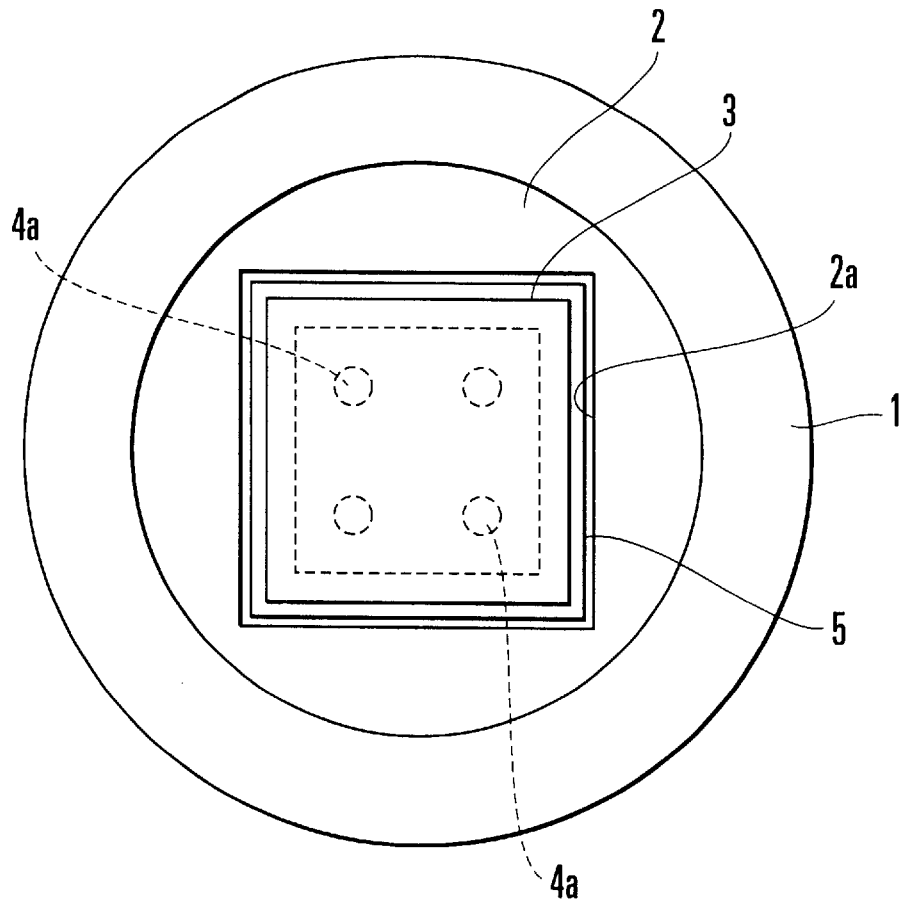

FIG. 1A shows a pressure sensor according to an embodiment of the present invention, and FIG. 1B shows the pressure sensor shown in FIG. 1A. Referring to FIG. 1A, a cylindrical sensor package 1 is made of a corrosion-resistant metal such as stainless steel. A thick disk-like glass base 2 is fitted on the inner wall of the sensor package 1. As shown in FIG. 1B, the glass base 2 has a square recess 2a at its central portion, and a support 2b on the bottom surface of the recess 2a to support a sensor chip (to be described later).

A sensor chip 3 is mounted on the support 2b of the glass base 2. Electrode extraction pins (to be referred to as electrode pins hereinafter) 4 are buried in the glass base 2 to extend through the support 2b, and serve as lead members. A metal plate 5 is buried slightly inside the support 2b of the glass base 2 to correspond to the periphery of the sensor chip 3. An atmospheric pressure introduction pipe 6 is buried in the glass base 2 to extend through the central portion of the support 2b. The electrode pins 4 respectively have heads 4a to be exposed from the support 2b of the glass base 2. The metal plate 5 is made of an Fe—Cr alloy, Fe—Ni—Cr alloy, Fe—Ni alloy, Fe—Ni—Co alloy, Ni-group alloy, or the like, and forms a square frame.

A method of manufacturing the pressure sensor described above will be described with reference to FIGS. 2A to 2C, FIGS. 3A to 3F, and FIG. 4. First, how to fabricate the package on which the sensor chip 3 is to be mounted will be described.

Figure 2A:
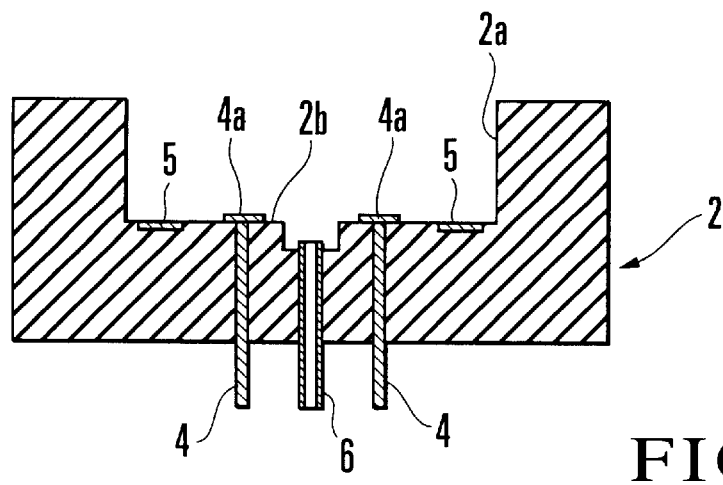
FIGS. 2A to 2C are sectional views showing the steps in fabricating a glass base shown in FIGS. 1A and 1B.

As shown in FIG. 2A, the thick disk-like (bottomed cylindrical) glass base 2 with a recess 2a is molded. When molding the glass base 2, the electrode pins 4, the metal plate 5 having the square shape, and the atmospheric pressure introduction pipe 6 are buried in the support 2b of the glass base 2 by integral molding. In this case, the electrode pins 4 are buried such that their heads 4a are exposed from the support 2b of the glass base 2 and their distal ends project from the lower side of the glass base 2.

In a hole-free absolute pressure type structure which does not use an atmospheric pressure introduction pipe 6, the step of burying the atmospheric pressure introduction pipe 6 is eliminated. In this absolute pressure type structure as well, the completely same effect as that of the present invention can be obtained.

Figure 2B:
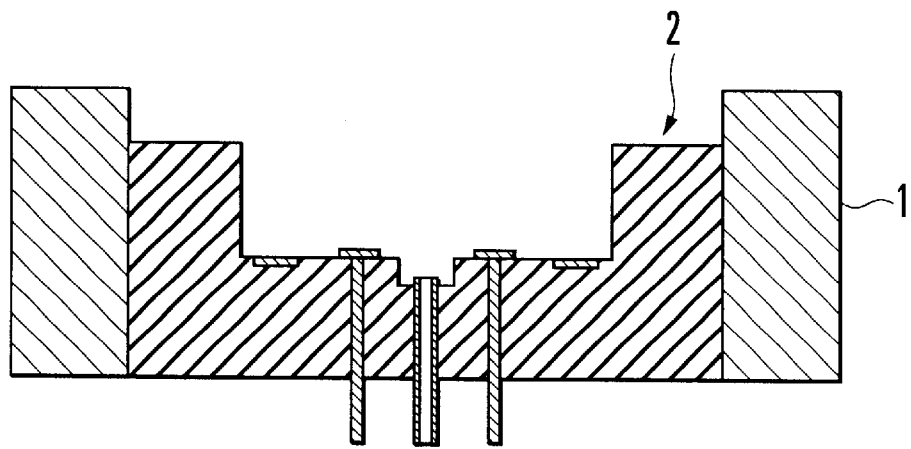
Figure 2C:
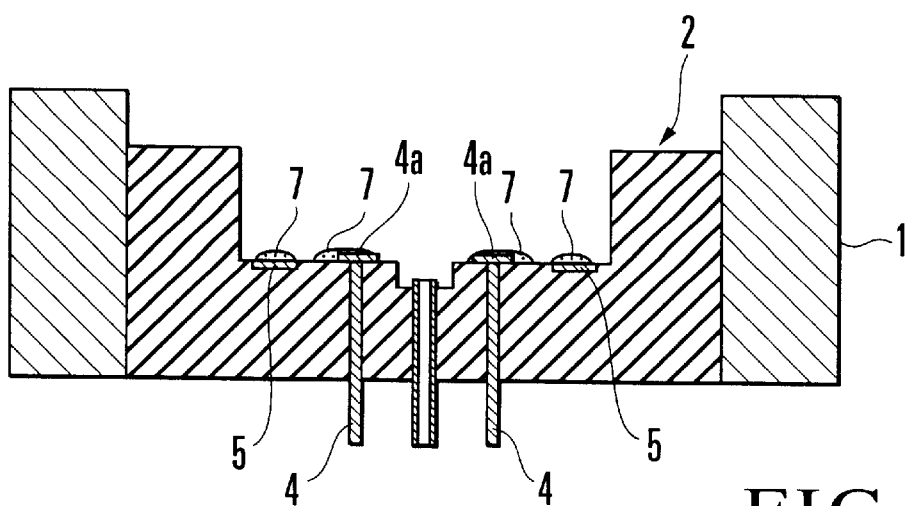

As shown in FIG. 2B, the glass base 2 is inserted in the sensor package 1 and heated. The glass base 2 is thus fused so that it is hermetically bonded to the sensor package 1. As shown in FIG. 2C, solder coating is performed to form solder portions 7 on the heads 4a of the electrode pins 4 and the metal plate 5. Fabrication of the sensor package 1 is ended in this manner.

Figure 3A:
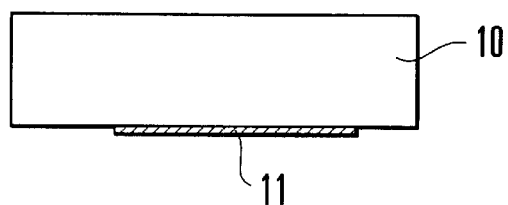
FIGS. 3A to 3F are views showing the steps in fabricating a sensor chip shown in FIGS. 1A and 1B.

How to fabricate the sensor chip 3 will be described. As shown in FIG. 3A, a conductive thin film is formed on the lower surface of a sapphire first substrate 10 on the diaphragm side and patterned to form a movable electrode 11 with a predetermined shape.

Figure 3B:
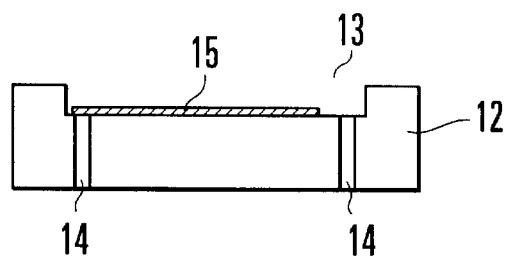

As shown in FIG. 3B, a recess 13 is formed in the center of the upper surface of a sapphire second substrate 12 by wet or dry etching, and through holes 14 for electrode leads are formed in the recess 13, so that the recess 13 and the outside communicate with each other through the through holes 14. A conductive thin film is formed at the center of the bottom surface of the recess 13 and patterned to form a stationary electrode 15 with a predetermined shape. The conductive thin films on the substrates 10 and 12 can be formed by CVD (Chemical Vapor Deposition), vacuum deposition, sputtering, or the like.

Figure 3C:
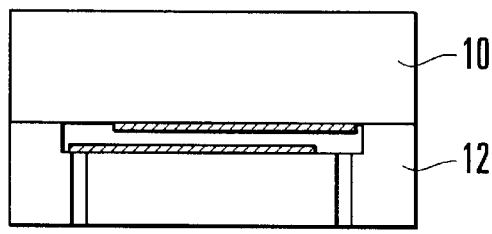
Figure 3D:
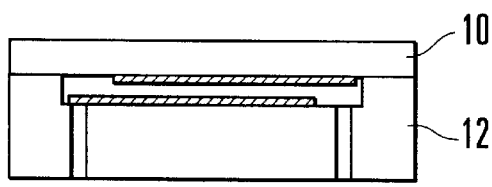

As shown in FIG. 3C, the first and second substrates 10 and 12 are overlaid in tight contact with each other, are loaded in a vacuum furnace, and are heated in vacuum, so that they are tightly bonded to each other. As shown in FIG. 3D, the first substrate 10 is polished to a predetermined thickness to form a diaphragm. This diaphragm surface may be formed by etching back the first substrate 10 in accordance with wet etching, dry etching, or the like.

Figure 3E:
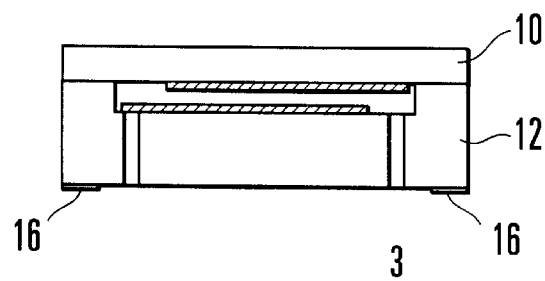
Figure 3F:
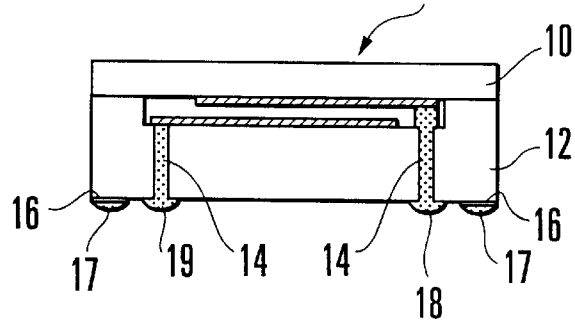

As shown in FIG. 3E, a bonding portion 16 comprised of a metal film is formed along the periphery of the lower surface of the second substrate 12 by vacuum deposition to have a square frame-like shape. As shown in FIG. 3F, solder coating is performed to form a solder portion 17 on the bonding portion 16. During solder coating, solder also fills the through holes 14, so that electrodes 18 connected to the movable electrode 11 and electrodes 19 connected to the stationary electrode 15 are formed inside the bonding portion 16.

The bonding portion 16 need not form a square frame, but a plurality of bonding portions 16 may be formed at predetermined intervals. To form the electrodes 18 and 19 on the sensor chip 3 by soldering, preplaced brazing in a solder furnace is performed. In this manner, fabrication of the sensor chip 3 is ended.

Figure 4:
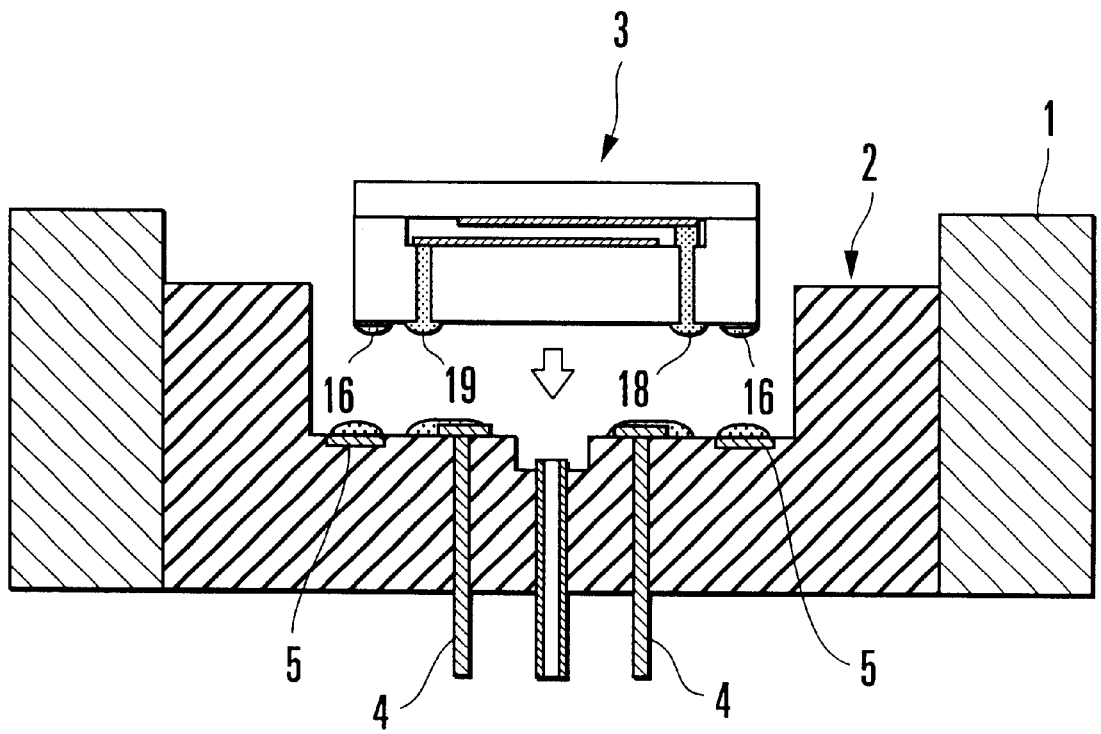
FIG. 4 is a sectional view showing a method of manufacturing the pressure sensor shown in FIGS. 1A and 1B.

Finally, as shown in FIG. 4, the sensor chip 3 and glass base 2 are aligned such that the bonding portion 16 of the sensor chip 3, and the electrodes 18 and 19 of the sensor chip 3 substantially, respectively oppose the metal plate 5 of the glass base 2 and the heads 4a of the electrode pins 4 of the glass base 2. Subsequently, the aligned sensor chip 3 is placed on the glass base 2. The sensor chip 3 and glass base 2 are then heated to fuse solder, thereby soldering them with each other. In this manner, fabrication of the pressure sensor is ended.

According to the above embodiment, since the glass base 2 is seal-bonded to the inner wall of the sensor package 1 to close the space in the sensor package 1, a heat stress from the sensor package 1 can be canceled by the whole glass base 2. Since the electrode pins 4 are buried during fabrication of the glass base 2, the electrodes 18 and 19 of the sensor chip 3 can be connected to the heads 4a of the electrode pins 4 by only fixing the sensor chip 3 to the glass base 2.

If a metal layer is formed on the glass based by metallizing or the like, the number of manufacturing steps increases by one. According to the above embodiment, since the electrode pins 4 and metal plate 5 are buried in the glass base 2 by integral molding during fabrication of the glass base 2, the number of steps does not increase.

Figure 6:
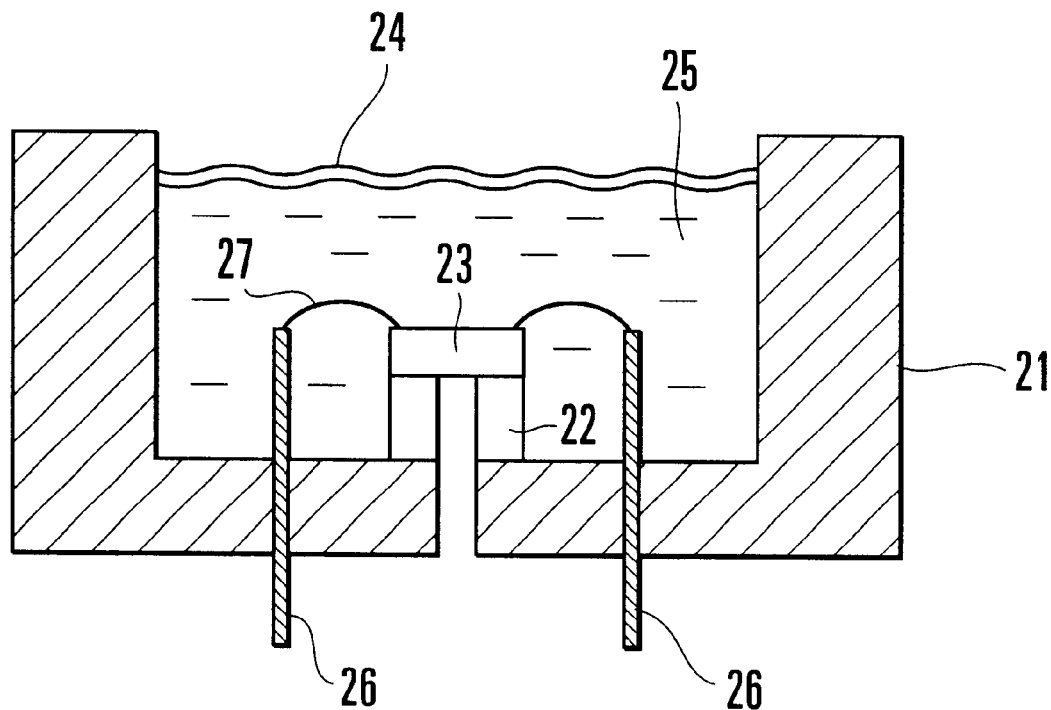
FIG. 6 is a sectional view of a conventional pressure sensor.
Figures 7A, 7B:
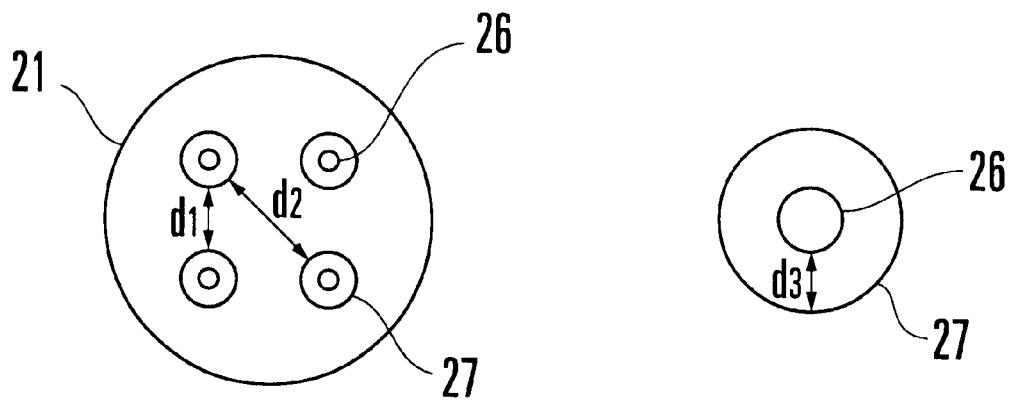
FIGS. 7A and 7B are plan views of the electrode portion of the pressure sensor shown in FIG. 6.

In the conventional pressure sensor shown in FIG. 6, the distances d1 and d2 between the electrode extraction pins, and the insulating distance cannot be decreased. According to the present invention, since the electrode pins 4 are buried in the glass base 2, this conventional problem does not exist basically, and the pressure sensor can be downsized.

Figure 5:
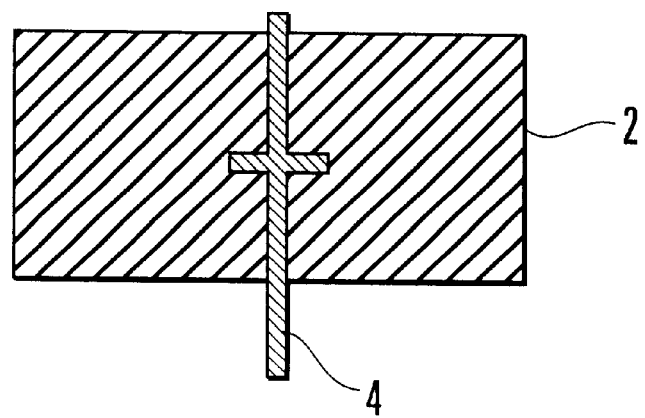
FIG. 5 is a sectional view of a glass base employed when a center-collared pin is used as an electrode extraction pin.

According to the above embodiment, as shown in FIG. 5, since center-collared pins can be used as the electrode pins 4, a higher pressure resistance of the pins can be ensured in the longitudinal direction, greatly contributing to an increase in pressure resistance of the package. In the conventional pressure sensor shown in FIG. 6, if center-collared pins are used, a large insulating distance cannot be obtained. Inversely, if a large insulating distance is to be obtained, the whole pressure sensor becomes very large, leading to a large bonding distance. Such a pressure sensor cannot be realized as a product.

While the heads 4a of the electrode pins 4 and the electrodes 18 and 19 are electrically bonded to each other by soldering in the above embodiment, this electrical bond may be attained by brazing or conductive glass bonding. While soldering is performed for die bonding of the bonding portion 16 and the surface of the glass base 2, this die bonding may be attained by brazing or glass encapsulation. To fix the sensor chip 3 and to extract the electrodes simultaneously, electrical bonding and die bonding described above must be performed in accordance with the same bonding method. When the metal plate 5 is to be buried in the surface of the glass base 2 opposing the bonding portion 16, it can be achieved by only soldering and brazing among the bonding methods described above.

The material of the glass base 2 includes sapphire glass.

As has been described above, according to the present invention, the electrode extraction pins and electrodes are bonded by soldering, and the bonding portion and the surface of the glass base are bonded by soldering, so that the sensor chip can be fixed and the electrodes can be extracted simultaneously. As the sensor chip is directly bonded to the glass base, the manufacturing steps are simplified, thereby improving the yield.

Since the electrode extraction pins are buried in the glass base, the resultant pressure sensor can be more downsized than a conventional pressure sensor in which electrode extraction pins are fixed to a metal sensor package with a glass hermetic seal. Since the center-collared pins can be used as the electrode extraction pins, a higher pressure resistance of the pins can be ensured in the longitudinal direction, largely contributing to an increase in pressure resistance of the package.

Since the electrode extraction pins and the metal plate can be buried simultaneously during molding of the glass base, no soldering metallizing portion need be formed on the glass base, and the number of manufacturing steps does not increase. Also, a larger fixing force than that obtained by metallizing can be expected.

What is claimed is:

1. A pressure sensor comprising:

a cylindrical sensor package;

a glass base seal-bonded to an inner surface of said sensor package to close a space in said sensor package;

a sensor chip mounted on said glass base and configured to directly contact a measurement fluid, said sensor chip having electrodes and a metal bonding portion on a surface thereof opposing said glass base, said bonding portion being die-bonded to a surface of said glass base, and lead members arranged to oppose said electrodes and buried to extend through said glass base, one end of each of said lead members exposed from said surface of said glass surface being electrically bonded to a corresponding one of said electrodes.

2. A sensor according to claim 1, wherein said sensor further comprises a metal plate fixed to said surface of said glass base opposing said bonding portion, and said bonding portion is die-bonded to said metal plate.

3. A sensor according to claim 2, wherein said bonding portion is comprised of a metal film formed along a periphery of said sensor chip, and said metal plate has a rectangular frame-like shape to correspond to said metal film.

4. A sensor according to claim 1, wherein said glass base is formed of a thick plate-like glass disk with a recess at a central portion thereof, and said sensor chip is mounted on a support on a bottom surface of said recess.

5. A method of manufacturing a pressure sensor, comprising the steps of:

integrally molding a glass base and lead members buried to extend through said glass base;

seal-bonding said glass base with said lead members to an inner surface of a sensor package;

mounting a sensor chip configured to directly contact a measurement fluid, said sensor chip having electrodes and a metal bonding portion, on said glass base in said sensor package;

electrically bonding said lead members exposed from a surface of said glass base and said electrodes to each other; and die-bonding said bonding portion and said surface of said glass substrate to each other.

6. The method of claim 5, wherein integrally molding comprises simultaneously burying a metal plate in said surface of said glass base opposing said bonding portion, and die-bonding comprises die-bonding said bonding portion and said metal plate to each other.

7. The method of claim 5, wherein electrically bonding comprises performing bonding by employing a method selected from the group consisting of soldering, brazing, and conductive glass bonding.

8. The method of claim 5, wherein die-bonding comprises performing bonding by employing a method selected from the group consisting of soldering, brazing, and glass encapsulation.

9. The pressure sensor of claim 1 wherein the sensor chip comprises a diaphragm portion being formed in contact with an internal space of the sensor chip, a movable electrode being formed in the inside of a diaphragm portion and being connected to an electrode of the sensor chip, and a fixed electrode being formed in the internal space facing with the movable electrode and being connected to the electrode of the sensor chip, the sensor chip being applied to a capacitive pressure sensor.

10. The pressure sensor of claim 1, wherein the sensor chip is made of sapphire.

* * * * *